(12) United States Patent
Wang et al.

(10) Patent No.: US 10,992,291 B2
(45) Date of Patent: Apr. 27, 2021

(54) TRUE RANDOM NUMBER GENERATOR BASED ON VOLTAGE-CONTROLLED OSCILLATOR

(71) Applicant: Ningbo University, Zhejiang (CN)

(72) Inventors: Pengjun Wang, Zhejiang (CN); Zhen Li, Zhejiang (CN); Gang Li, Zhejiang (CN); Huihong Zhang, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 16/744,228

(22) Filed: Jan. 16, 2020

(65) Prior Publication Data

US 2020/0228104 A1    Jul. 16, 2020

(30) Foreign Application Priority Data

Jan. 16, 2019    (CN) .......................... 201910041882.9

(51) Int. Cl.
*G06F 7/58* (2006.01)
*H03K 3/84* (2006.01)
*H03K 19/21* (2006.01)
*H03K 3/037* (2006.01)
*H03K 3/03* (2006.01)

(52) U.S. Cl.
CPC .............. *H03K 3/84* (2013.01); *H03K 3/037* (2013.01); *H03K 3/0315* (2013.01); *H03K 19/21* (2013.01)

(58) Field of Classification Search
CPC ............ G06F 7/588; H03K 3/84; H04B 1/719
See application file for complete search history.

(56) References Cited

U.S. PATENT DOCUMENTS

2008/0183788 A1 *   7/2008   Song ...................... G06F 7/588
                                                          708/251

OTHER PUBLICATIONS

Deng Huan et al., "Oscillator-based High Performance Truly Random Number Generator," Research & Progress of SSE, vol. 27, Issue 3, Aug. 2007, pp. 391-396.

* cited by examiner

*Primary Examiner* — Sibin Chen
(74) *Attorney, Agent, or Firm* — JCIPRNET

(57) ABSTRACT

A true random number generator based on a voltage-controlled oscillator includes a thermal noise generator, a ring oscillator, a voltage-controlled oscillator, a D flip-flop, and a post-processing circuit. The D flip-flop has a clock terminal, an input terminal, and an output terminal. An output terminal of the thermal noise generator is connected with an input terminal of the voltage-controlled oscillator. An output terminal of the voltage-controlled oscillator is connected with the clock terminal of the D flip-flop. An output terminal of the ring oscillator is connected with the input terminal of the D flip-flop. The output terminal of the D flip-flop is connected with an input terminal of the post-processing circuit. An input terminal of the thermal noise generator is connected with a reference level. The thermal noise generator includes a digital-analog converter, an operational amplifier, a first resistor, a second resistor, a third resistor, and a fourth resistor.

4 Claims, 4 Drawing Sheets

TRUE RANDOM NUMBER GENERATOR BASED ON VOLTAGE-CONTROLLED OSCILLATOR

CROSS-REFERENCE TO RELATED APPLICATION

This application claims the priority benefit of China application serial no. 201910041882.9, filed on Jan. 16, 2019. The entirety of the above-mentioned patent application is hereby incorporated by reference herein and made a part of this specification.

TECHNICAL FIELD

The invention relates to a true random number generator, in particular to a true random number generator based on a voltage-controlled oscillator.

DESCRIPTION OF RELATED ART

A true random number generator introduced in the literature (Deng Huan, Jin Ronghua, Chen Jun, et al., Oscillator-based High Performance Truly Random Number Generator [J]. Research & Progress of SSE, 2007, 27(3):391-396.) has a structure shown in FIG. 1. In this true random number generator, an operational amplifier $A_1$ amplifies thermal noises of a resistor $R_{noise}$, the amplified thermal noises and a triangular wave amplified by the operational amplifier $A_1$ after charging and discharging of $I_{cp}$ pairs of capacitors $C_s$ are superimposed to be converted into a jittered slow oscillation signal clkslow by a Schmitt trigger comparator, this slow oscillation signal is fed back to the input terminal of the operational amplifier $A_1$ by a Chargepump to form a closed-loop structure used to compensate for offset voltages and is also used as a clock sampling signal of a T trigger to sample stable fast oscillation signals so as to generate an original random sequence, which is in turn input into a post-processing circuit to further improve the randomness.

However, such true random number generator has the following problems: 1. The thermal noises are amplified only once by the operational amplifier $A_1$ having a finite gain bandwidth, thus, the slow oscillation signal has little jitter, the bit rate of the output sequence is low, and the application requirement of a high-speed circuit can barely met. 2. The circuit is of a closed-loop structure, and consequentially, the bit frequency is constant, and the bit rate and the randomness cannot be traded off according to an application scenario.

BRIEF SUMMARY OF THE INVENTION

The technical issue to be settled by the invention is to provide a true random number generator based on a voltage-controlled oscillator. The true random number generator fulfills a high bit rate of an output sequence, meets the application requirement of a high-speed circuit, is able to trade off the bit rate and the randomness according to an application scenario, and has high flexibility.

The technical solution adopted by the invention to settle the above-mentioned technical issue is as follows: a true random number generator based on a voltage-controlled oscillator includes a thermal noise generator, a ring oscillator, the voltage-controlled oscillator, a D flip-flop, and a post-processing circuit, wherein the D flip-flop has a clock terminal, an input terminal and an output terminal, an output terminal of the thermal noise generator is connected with an input terminal of the voltage-controlled oscillator, an output terminal of the voltage-controlled oscillator is connected with the clock terminal of the D flip-flop, an output terminal of the ring oscillator is connected with the input terminal of the D flip-flop, the output terminal of the D flip-flop is connected with an input terminal of the post-processing circuit, and an input terminal of the thermal noise generator is connected with a reference level. The thermal noise generator includes a digital-analog converter, an operational amplifier, a first resistor, a second resistor, a third resistor and a fourth resistor, wherein an input terminal of the digital-analog converter is connected with one terminal of the third resistor, and a connecting terminal of the input terminal of the digital-analog converter and the one terminal of the third resistor is the input terminal of the thermal noise generator. An output terminal of the digital-analog converter is connected with one terminal of the first resistor, the other terminal of the first resistor is connected with a non-inverting input terminal of the operational amplifier, one terminal of the second resistor is connected with an inverting input terminal of the operational amplifier, and the other terminal of the third resistor and the other terminal of the second resistor are connected with one terminal of the fourth resistor. The other terminal of the fourth resistor is connected with an output terminal of the operational amplifier, and a connecting terminal of the other terminal of the fourth resistor and the output terminal of the operational amplifier is the output terminal of the thermal noise generator.

The voltage-controlled oscillator includes a first MOS transistor, a second MOS transistor, a third MOS transistor, a fourth MOS transistor, a fifth MOS transistor, a sixth MOS transistor, a first capacitor, a Schmitt trigger, and a first inverter, wherein the first MOS transistor, the fifth MOS transistor, and the sixth MOS transistor are N-type MOS transistors, the second MOS transistor, the third MOS transistor, and the fourth MOS transistor are P-type MOS transistors. A gate of the first MOS transistor is connected with a gate of the sixth MOS transistor, and a connecting terminal of the gate of the first MOS transistor and the gate of the sixth MOS transistor is the input terminal of the voltage-controlled oscillator. A source of the first MOS transistor and a source of the sixth MOS transistor are grounded. A drain of the first MOS transistor, a gate of the second MOS transistor, a drain of the second MOS transistor, and a gate of the third MOS transistor are connected. A source of the second MOS transistor and a source of the third MOS transistor are accessed to a power supply. A drain of the third MOS transistor is connected with a source of the fourth MOS transistor. A drain of the fourth MOS transistor, a drain of the fifth MOS transistor, one terminal of the first capacitor, and an input terminal of the Schmitt trigger are connected. A gate of the fourth MOS transistor, a gate of the fifth MOS transistor, and an output terminal of the first inverter are connected, and a connecting terminal of the gate of the fourth MOS transistor, the gate of the fifth MOS transistor, and the output terminal of the first inverter is the output terminal of the voltage-controlled oscillator. A source of the fifth MOS transistor is connected with a drain of the sixth MOS transistor. The other terminal of the first capacitor is grounded. An output terminal of the Schmitt trigger is connected with an input terminal of the first inverter. This circuit controls the gate voltages of the first MOS transistor and the sixth MOS transistor to change the charging and discharging current of the first capacitor to adjust the oscillation frequency, has few modules, and is simple in structure and relatively stable in performance.

The ring oscillator includes 19 inverters and a buffer, wherein an output terminal of the $m^{th}$ inverter is connected with an input terminal of the (m+1)$^{th}$ inverter, and m=1, 2, . . . , 18. An input terminal of the 1$^{st}$ inverter and an output terminal of the 19$^{th}$ inverter is connected with an input terminal of the buffer. An output terminal of the buffer is the output terminal of the ring oscillator. The ring oscillator adopts an all-digital circuit structure, thereby being low in power consumption and occupying a small area while the performance meets the functional requirements of the invention.

The post-processing circuit includes four D flip-flop groups and a four-input XOR gate, wherein each D flip-flop group includes 10 D flip-flops. In each D flip-flop group, an output terminal of the j$^{th}$ D flip-flop is connected with an input terminal of the (j+1)$^{th}$ D flip-flop, j=1, 2, . . . , 9, an input terminal of the 1$^{st}$ D flip-flop is an input terminal of the D flip-flop group, and an output terminal of the 10$^{th}$ D flip-flop is an output terminal of the D flip-flop group. Clock terminals of the 10 D flip-flops are connected, and a connecting terminal of the clock terminals of the 10 D flip-flops is a clock terminal of the D flip-flop group. The clock terminals of the four D flip-flop groups are connected, and a connecting terminal of the clock terminals of the four D flip-flop groups is a clock terminal, allowing a clock signal to be accessed therein, of the post-processing circuit. An input terminal of the 1$^{st}$ D flip-flop group is an input terminal of the post-processing circuit, an output terminal of the 1$^{st}$ D flip-flop group and an input terminal of the 2$^{nd}$ D flip-flop group are connected with a first input terminal of the four-input XOR gate, an output terminal of the 2$^{nd}$ D flip-flop group and an input terminal of the 3$^{rd}$ D flip-flop group are connected with a second input terminal of the four-input XOR gate, an output terminal of the 3$^{rd}$ D flip-flop group and an input terminal of the 4$^{th}$ D flip-flop group are connected with a third input terminal of the four-input XOR gate, an output terminal of the 4$^{th}$ D flip-flop group is connected with a fourth input terminal of the four-input XOR gate, and an output terminal of the four-input XOR gate is an output terminal of the post-processing circuit. The post-processing circuit is simple in structure, can eliminate the self-correlation of a sequence, and does not sacrifice the sequence bit rate compared with the Von Neumann correction method.

Compared with the prior art, the invention has the following advantages: the true random number generator is composed of the thermal noise generator, the ring oscillator, the voltage-controlled oscillator, the D flip-flop, and the post-processing circuit, wherein the output terminal of the thermal noise generator is connected with the input terminal of the voltage-controlled oscillator, the output terminal of the voltage-controlled oscillator is connected with the clock terminal of the D flip-flop, the output terminal of the ring oscillator is connected with the input terminal of the D flip-flop, the output terminal of the D flip-flop is connected with the input terminal of the post-processing circuit, the input terminal of the thermal noise generator is connected with a reference level, and the thermal noise generator includes the digital-analog converter, the operational amplifier, the first resistor, the second resistor, the third resistor, and the fourth resistor. During work, the output terminal of the thermal noise generator generates an output signal formed by superposition of a DC level and a resistor thermal noise according to the reference level accessed to the thermal noise generator, the DC level determines the central frequency of the voltage-controlled oscillator, the resistor thermal noise intensifies the frequency jitter of the voltage-controlled oscillator, slow oscillation signals having a central frequency of 1-20 MHz are generated by the voltage-controlled oscillator according to the DC level and the resistor thermal noise and used as clock signals of the D flip-flop, the output terminal of the ring oscillator generates fast oscillation signals having a fixed frequency of 1.3 GHz, and the D flip-flop is controlled by the slow oscillation signals to sample the fast oscillation signals. Because the frequency jitter of the slow oscillation signals is far greater than the period of the fast oscillation signals, the D flip-flop generates an original random sequence output, and the post-processing circuit generates a final random sequence output after eliminating the non-uniformity and self-correlation of the original random sequence output. The whole circuit of the invention is of an open-loop structure thanks to the thermal noise generator composed of the digital-analog converter, the operational amplifier, the first resistor, the second resistor, the third resistor, and the fourth resistor, the thermal noise generator is cascaded with the voltage-controlled oscillator, the operational amplifier in the thermal noise generator performs primary amplification on thermal noises generated by the first resistor and the second resistor in the thermal noise generator, and the voltage-controlled oscillator performs secondary amplification on the thermal noises generated in the thermal noise generator to increase the clock jitter, so that the bit rate of a random output sequence is increased, and the application requirements of a high-speed circuit can be met. The central frequency of the voltage-controlled oscillator can be changed through a change to the reference level accessed to the thermal noise generator, so that the true random number generator of the invention is able to trade off the bit rate and the randomness according to an application scenario and has high flexibility.

DETAILED DESCRIPTION OF THE INVENTION

The invention is further expounded as follows in combination with the accompanying drawings and embodiments.

Figure 1:
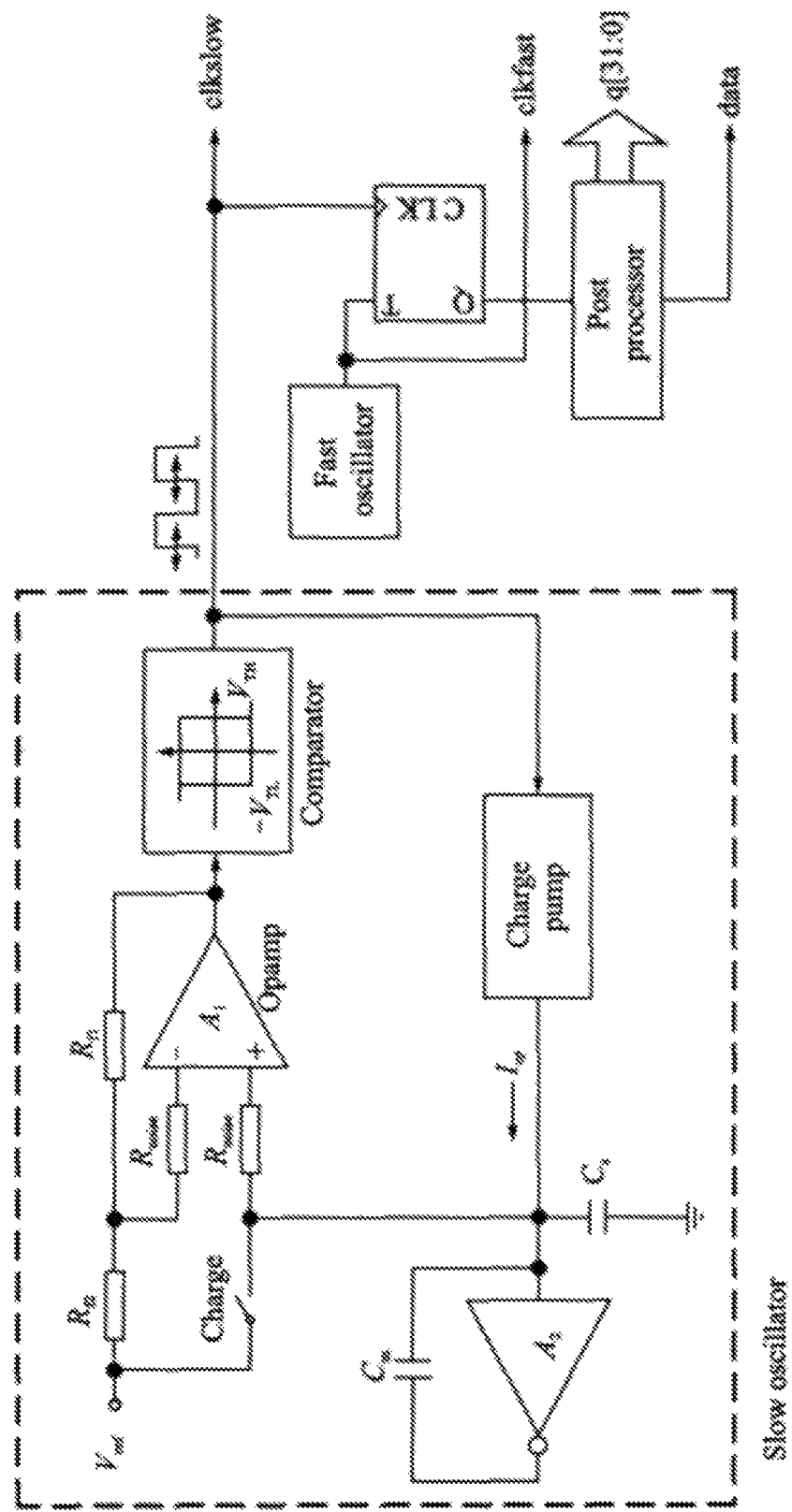
FIG. 1 is a structural view of an existing true random number generator.
Figure 2:
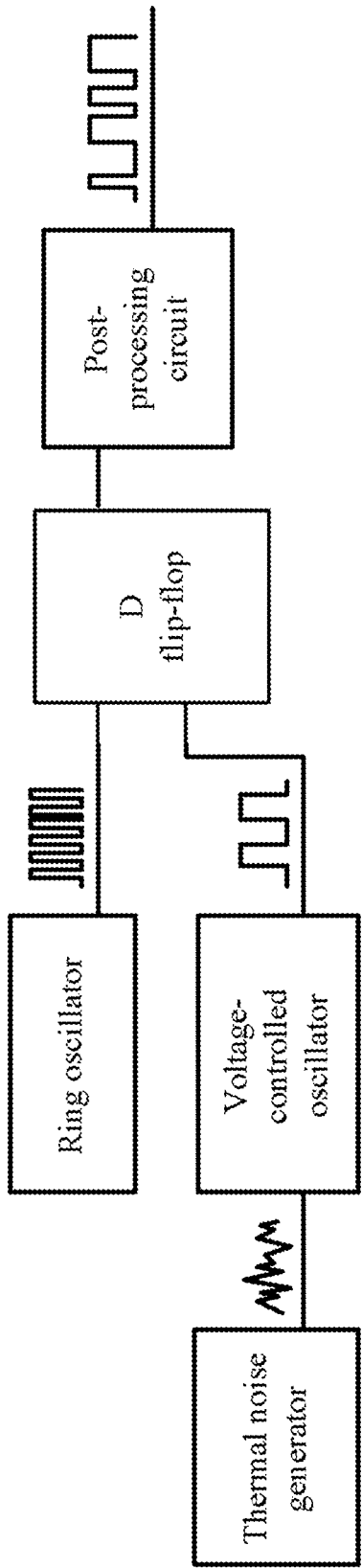
FIG. 2 is a structural view of a true random number generator of the invention.

Embodiment 1: as shown in FIG. 2, a true random number generator based on a voltage-controlled oscillator includes a thermal noise generator, a ring oscillator, a voltage-controlled oscillator, a D flip-flop and a post-processing circuit, wherein the D flip-flop has a clock terminal, an input terminal and an output terminal, an output terminal of the thermal noise generator is connected with an input terminal of the voltage-controlled oscillator, an output terminal of the voltage-controlled oscillator is connected with the clock terminal of the D flip-flop, an output terminal of the ring oscillator is connected with the input terminal of the D flip-flop, the output terminal of the D flip-flop is connected with an input terminal of the post-processing circuit, and an input terminal of the thermal noise generator is connected with a reference level.

Figure 3:
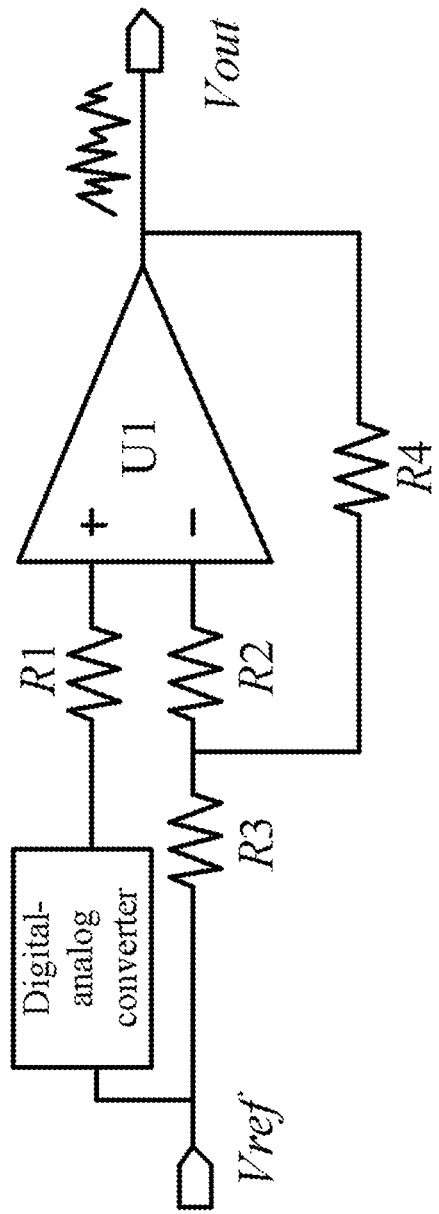
FIG. 3 is a structural view of a thermal noise generator of the true random number generator of the invention.

As shown in FIG. 3, in this embodiment, the thermal noise generator includes a digital-analog converter, an operational amplifier U1, a first resistor R1, a second resistor R2, a third resistor R3, and a fourth resistor R4, wherein an input terminal of the digital-analog converter is connected with one terminal of the third resistor R3, and a connecting terminal of the input terminal of the digital-analog converter and the one terminal of the third resistor R3 is the input terminal of the thermal noise generator. An output terminal of the digital-analog converter is connected with one terminal of the first resistor R1, the other terminal of the first resistor R1 is connected with a non-inverting input terminal of the operational amplifier U1, one terminal of the second resistor R2 is connected with an inverting input terminal of the operational amplifier U1, and the other terminal of the third resistor R3 and the other terminal of the second resistor R2 are connected with one terminal of the fourth resistor R4. The other terminal of the fourth resistor R4 is connected with an output terminal of the operational amplifier U1, and a connecting terminal of the other terminal of the fourth resistor R4 and the output terminal of the operational amplifier U1 is the output terminal of the thermal noise generator.

Figure 4:
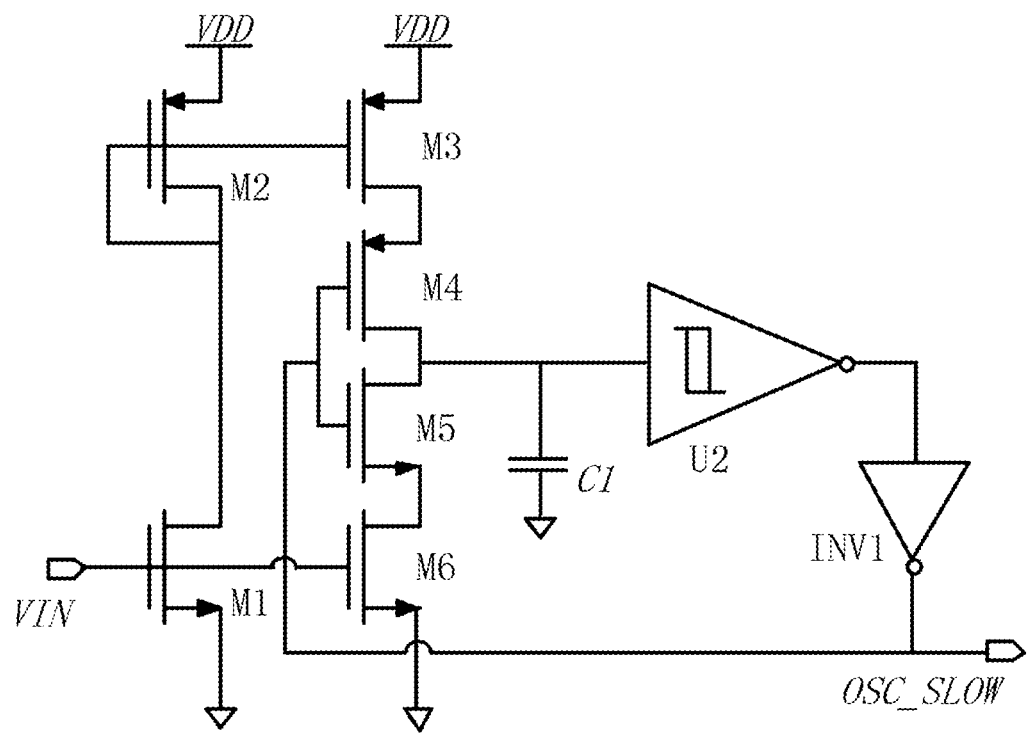
FIG. 4 is a circuit diagram of a voltage-controlled oscillator of the true random number generator of the invention

Embodiment 2: the difference between Embodiment 2 basically the same as Embodiment 1 and Embodiment 1 is as follows As shown in FIG. 4, in this embodiment, the voltage-controlled oscillator includes a first MOS transistor M1, a second MOS M2 transistor, a third MOS transistor M3, a fourth MOS transistor M4, a fifth MOS transistor M5, a sixth MOS transistor M6, a first capacitor C1, a Schmitt trigger U2, and a first inverter INV1, wherein the first MOS transistor M1, the fifth MOS transistor M5, and the sixth MOS transistor M6 are N-type MOS transistors, and the second MOS transistor M2, the third MOS transistor M3, and the fourth MOS transistor M4 are P-type MOS transistors. A gate of the first MOS transistor M1 is connected with a gate of the sixth MOS transistor M6, and a connecting terminal of the gate of the first MOS transistor M1 and the gate of the sixth MOS transistor M6 is the input terminal of the voltage-controlled oscillator. A source of the first MOS transistor M1 and a source of the sixth MOS transistor M6 are grounded, a drain of the first MOS transistor M1, a gate of the second MOS transistor M2, a drain of the second MOS transistor M2, and a gate of the third MOS transistor M3 are connected, a source of the second MOS transistor M2 and a source of the third MOS transistor M3 are accessed to a power supply, a drain of the third MOS transistor M3 is connected with a source of the fourth MOS transistor M4, and a drain of the fourth MOS transistor M4, a drain of the fifth MOS transistor M5, one terminal of the first capacitor C1, and an input terminal of the Schmitt trigger U2 are connected. A gate of the fourth MOS transistor M4, a gate of the fifth MOS transistor M5, and an output terminal of the first inverter INV1 are connected, and a connecting terminal of the gate of the fourth MOS transistor M4, the gate of the fifth MOS transistor M5, and the output terminal of the first inverter INV1 is the output terminal of the voltage-controlled oscillator. A source of the fifth MOS transistor M5 is connected with a drain of the sixth MOS transistor M6, the other terminal of the first capacitor C1 is grounded, and an output terminal of the Schmitt trigger U2 is connected with an input terminal of the first inverter INV1.

Figure 5:
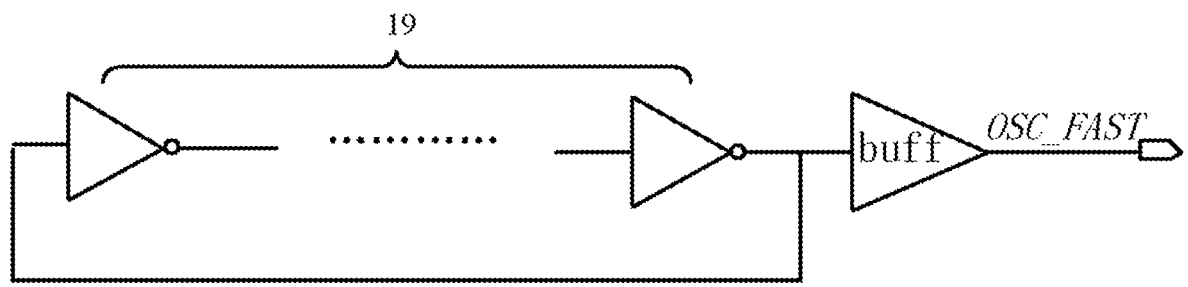
FIG. 5 is a circuit diagram of a ring oscillator of the true random number generator of the invention.

As shown in FIG. 5, in this embodiment, the ring oscillator includes 19 inverters and a buffer BUFF, wherein an output terminal of the $m^{th}$ inverter is connected with an input terminal of the $(m+1)^{th}$ inverter, and m=1, 2, . . . , 18. An input terminal of the $1^{st}$ inverter, an output terminal of the $19^{th}$ inverter, and an input terminal of the buffer BUFF are connected, and an output terminal of the buffer BUFF is the output terminal of the ring oscillator.

Figure 6:
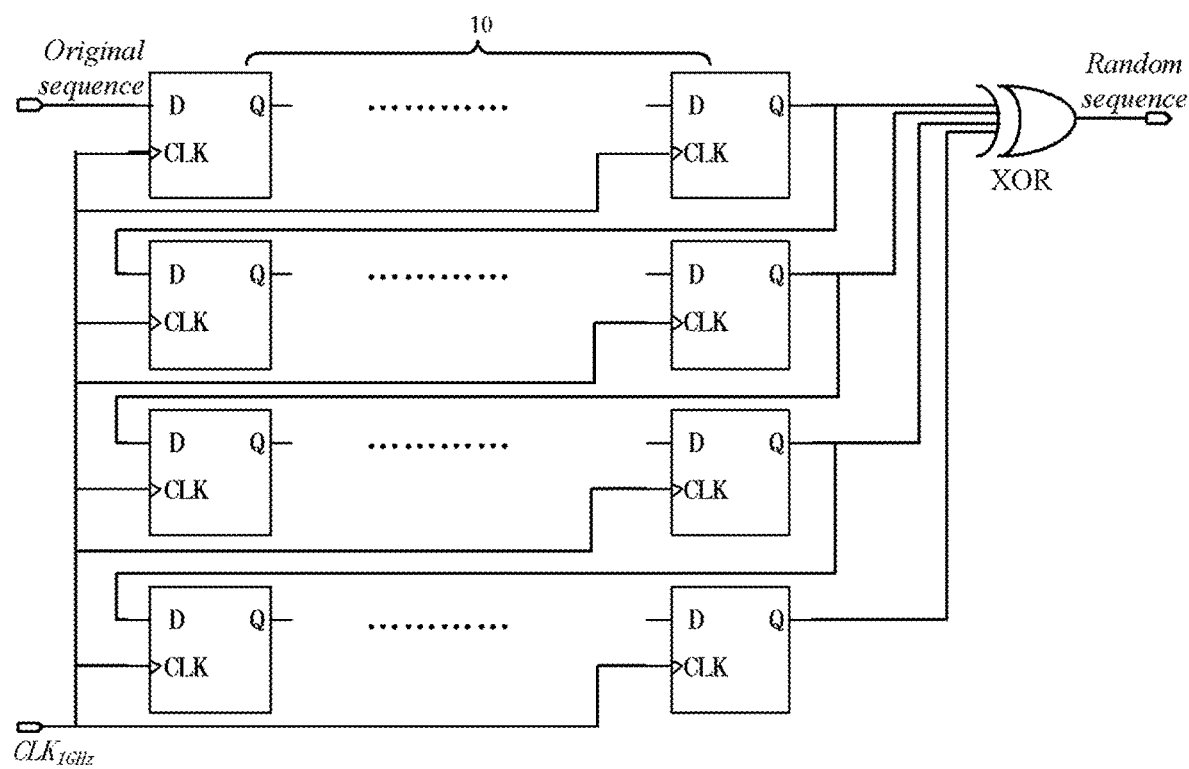
FIG. 6 is a post-processing circuit diagram of the true random number generator of the invention.

As shown in FIG. 6, in this embodiment, the post-processing circuit includes four D flip-flop groups and a four-input XOR gate, wherein each D flip-flop group includes 10 D flip-flops. In each D flip-flop group, an output terminal of the $j^{th}$ D flip-flop is connected with an input terminal of the $(j+1)^{th}$ D flip-flop, j=1, 2, . . . , 9, the input terminal of the $1^{st}$ D flip-flop is the input terminal of the D flip-flop group, and an output terminal of the $10^{th}$ D flip-flop is an output terminal of the D flip-flop group. Clock terminals of the 10 D flip-flops are connected, and a connecting terminal of the clock terminals of the 10 D flip-flops is a clock terminal of the D flip-flop group. The clock terminals of the four D flip-flop groups are connected, and a connecting terminal of the clock terminals of the four D flip-flop groups is a clock terminal, allowing a clock signal to be accessed therein, of the post-processing circuit. An input terminal of the $1^{st}$ D flip-flop group is an input terminal of the post-processing circuit, an output terminal of the $1^{st}$ D flip-flop group and an input terminal of the $2^{nd}$ D flip-flop group are connected with a first input terminal of the four-input XOR gate, an output terminal of the $2^{nd}$ D flip-flop group and an input terminal of the $3^{rd}$ D flip-flop group are connected with a second input terminal of the four-input XOR gate, an output terminal of the $3^{rd}$ D flip-flop group and an input terminal of the $4^{th}$ D flip-flop group are connected with a third input terminal of the four-input XOR gate, an output terminal of the $4^{th}$ D flip-flop group is connected with a fourth input terminal of the four-input XOR gate, and an output terminal of the four-input XOR gate is an output terminal of the post-processing circuit.

What is claimed is:
1. A true random number generator based on a voltage-controlled oscillator, wherein the true random number generator comprises:
   a thermal noise generator;
   a ring oscillator;
   the voltage-controlled oscillator;
   a D flip-flop; and
   a post-processing circuit,
   wherein the D flip-flop has a clock terminal, an input terminal and an output terminal, an output terminal of the thermal noise generator is connected with an input terminal of the voltage-controlled oscillator, an output terminal of the voltage-controlled oscillator is connected with the clock terminal of the D flip-flop, an output terminal of the ring oscillator is connected with the input terminal of the D flip-flop, the output terminal of the D flip-flop is connected with an input terminal of the post-processing circuit, and an input terminal of the thermal noise generator is connected with a reference level,
   and the thermal noise generator comprises: a digital-analog converter; an operational amplifier; a first resistor; a second resistor; a third resistor; and a fourth resistor,
   wherein an input terminal of the digital-analog converter is connected with one terminal of the third resistor, and a connecting terminal of the input terminal of the digital-analog converter and the one terminal of the third resistor is the input terminal of the thermal noise generator, an output terminal of the digital-analog converter is connected with one terminal of the first resistor, the other terminal of the first resistor is connected with a non-inverting input terminal of the operational amplifier, one terminal of the second resistor is connected with an inverting input terminal of the operational amplifier, and the other terminal of the third resistor and the other terminal of the second resistor are connected with one terminal of the fourth resistor, the other terminal of the fourth resistor is connected with an output terminal of the operational amplifier, and a connecting terminal of the other terminal of the fourth resistor and the output terminal of the operational amplifier is the output terminal of the thermal noise generator.

2. The true random number generator based on a voltage-controlled oscillator according to claim 1, wherein the voltage-controlled oscillator comprises: a first MOS transistor; a second MOS transistor; a third MOS transistor; a fourth MOS transistor; a fifth MOS transistor; a sixth MOS transistor; a first capacitor; a Schmitt trigger; and a first inverter, wherein the first MOS transistor, the fifth MOS transistor, and the sixth MOS transistor are N-type MOS transistors, the second MOS transistor, the third MOS transistor, and the fourth MOS transistor are P-type MOS transistors, a gate of the first MOS transistor is connected with a gate of the sixth MOS transistor, and a connecting terminal of the gate of the first MOS transistor and the gate of the sixth MOS transistor is the input terminal of the voltage-controlled oscillator, a source of the first MOS transistor and a source of the sixth MOS transistor are grounded, a drain of the first MOS transistor, a gate of the second MOS transistor, a drain of the second MOS transistor, and a gate of the third MOS transistor are connected, a source of the second MOS transistor and a source of the third MOS transistor are accessed to a power supply, a drain of the third MOS transistor is connected with a source of the fourth MOS transistor, a drain of the fourth MOS transistor, a drain of the fifth MOS transistor, one terminal of the first capacitor, and an input terminal of the Schmitt trigger are connected, a gate of the fourth MOS transistor, a gate of the fifth MOS transistor, and an output terminal of the first inverter are connected, and a connecting terminal of the gate of the fourth MOS transistor, the gate of the fifth MOS transistor, and the output terminal of the first inverter is the output terminal of the voltage-controlled oscillator, a source of the fifth MOS transistor is connected with a drain of the sixth MOS transistor, the other terminal of the first capacitor is grounded, and an output terminal of the Schmitt trigger is connected with an input terminal of the first inverter.

3. The true random number generator based on a voltage-controlled oscillator according to claim 1, wherein the ring oscillator comprises: 19 inverters; and a buffer, wherein an output terminal of the $m^{th}$ inverter is connected with an input terminal of the $(m+1)^{th}$ inverter, and m=1, 2, . . . , 18, an input terminal of the 1st inverter and an output terminal of the 19th inverter is connected with an input terminal of the buffer, and an output terminal of the buffer is the output terminal of the ring oscillator.

4. The true random number generator based on a voltage-controlled oscillator according to claim 1, wherein the post-processing circuit comprises: four D flip-flop groups; and a four-input XOR gate, wherein each D flip-flop group comprises 10 D flip-flops, and in each D flip-flop group, an output terminal of the jth D flip-flop is connected with an input terminal of the (j+1)th D flip-flop, j=1, 2, . . . , 9, an input terminal of the 1st D flip-flop is an input terminal of the D flip-flop group, and an output terminal of the 10th D flip-flop is an output terminal of the D flip-flop group, clock terminals of the 10 D flip-flops are connected, and a connecting terminal of the clock terminals of the 10 D flip-flops is a clock terminal of the D flip-flop group, the clock terminals of the four D flip-flop groups are connected, and a connecting terminal of the clock terminals of the four D flip-flop groups is a clock terminal, allowing a clock signal to be accessed therein, of the post-processing circuit, an input terminal of the 1st D flip-flop group is an input terminal of the post-processing circuit, an output terminal of the 1st D flip-flop group and an input terminal of the 2nd D flip-flop group are connected with a first input terminal of the four-input XOR gate, an output terminal of the 2nd D flip-flop group and an input terminal of the 3rd D flip-flop group are connected with a second input terminal of the four-input XOR gate, an output terminal of the 3rd D flip-flop group and an input terminal of the 4th D flip-flop group are connected with a third input terminal of the four-input XOR gate, an output terminal of the 4th D flip-flop group is connected with a fourth input terminal of the four-input XOR gate, and an output terminal of the four-input XOR gate is an output terminal of the post-processing circuit.

* * * * *